United States Patent
Jung

(10) Patent No.: US 8,470,499 B2
(45) Date of Patent: Jun. 25, 2013

(54) METHOD AND SYSTEM OF FABRICATING ALTERNATING PHASE SHIFT MASK

(75) Inventor: Ho Yong Jung, Cheongju-si (KR)

(73) Assignee: SK Hynix Inc., Gyeonggi-do (KR)

( * ) Notice: Subject to any disclaimer, the term of this patent is extended or adjusted under 35 U.S.C. 154(b) by 163 days.

(21) Appl. No.: 12/979,471

(22) Filed: Dec. 28, 2010

(65) Prior Publication Data

US 2011/0159414 A1    Jun. 30, 2011

(30) Foreign Application Priority Data

Dec. 30, 2009    (KR) ................ 10-2009-0134696

(51) Int. Cl.
G03F 1/80 (2012.01)
G03F 1/68 (2012.01)

(52) U.S. Cl.
USPC ............................................. 430/5

(58) Field of Classification Search
USPC .................. 430/5, 30; 216/60; 250/492.1
See application file for complete search history.

(56) References Cited

U.S. PATENT DOCUMENTS

| 5,465,859 | A | 11/1995 | Chapple-Sokol et al. |
| 7,049,034 | B2 | 5/2006 | Martin et al. |
| 2003/0085198 | A1* | 5/2003 | Yi et al. ................ 216/60 |
| 2005/0026053 | A1* | 2/2005 | Martin et al. ............ 430/5 |
| 2006/0051681 | A1 | 3/2006 | Taylor |
| 2009/0277872 | A1* | 11/2009 | Yamamoto et al. ........ 216/60 |

FOREIGN PATENT DOCUMENTS

KR    1020090044417 A    5/2009

* cited by examiner

*Primary Examiner* — Stephen Rosasco
(74) *Attorney, Agent, or Firm* — William Park & Associates Patent Ltd.

(57) ABSTRACT

An alternating phase shift mask is fabricated by defining transparent regions by forming light blocking patterns over a transparent substrate and forming an etch stop layer within the transparent substrate of a phase shift region among the transparent regions. The transparent substrate of the phase shift region may be etched and the etching may be deemed to be completed based upon radiation detected in an area under the etch stop layer.

4 Claims, 4 Drawing Sheets

METHOD AND SYSTEM OF FABRICATING ALTERNATING PHASE SHIFT MASK

CROSS-REFERENCES TO RELATED APPLICATIONS

The present application claims priority under 35 U.S.C 119(a) to Korean application number 10-2009-0134696, filed on Dec. 30, 2009, in the Korean intellectual property Office, which is incorporated herein by reference in its entirety set forth in full.

BACKGROUND

Exemplary embodiments of the present invention relate to a photomask for use in a semiconductor fabrication, and more particularly, to a method and system of fabricating an alternating phase shift mask.

As the integration density of semiconductor devices has recently increased, patterns constituting semiconductor devices have also become fine. With such a trend, when fine patterns are formed, phase shift masks (PSM) are widely used as one of resolution enhancement technologies. One of such phase shift masks is an alternating phase shift mask. The alternating phase shift mask has a structure in which phase shift patterns are disposed on a binary mask. In a phase shift region where the phase shift patterns are disposed, an electric field is shifted by 180 degrees and thus adjacent patterns do not interfere with each other. Accordingly, small patterns can be patterned at a high contrast, as compared to the binary mask.

FIG. 1 is a cross-sectional view illustrating an example of an alternating phase shift mask. Referring to FIG. 1, the alternating phase shift mask includes light blocking patterns 120 on a transparent substrate 110 such as a quartz substrate. The light blocking patterns 120 may be formed using a chromium (Cr) film. A trench etched by a predetermined depth d is disposed in a portion of the transparent substrate 110 exposed by the light blocking patterns 120. The trench serves as a phase shift pattern 112.

In fabricating such an alternating phase shift mask, it is important to precisely control the depth d of the trench-shaped phase shift pattern 112. This is because the depth d of the trench-shaped phase shift pattern 112 determines a phase difference in the phase shift region. Since it is not easy to detect an etch end point due to the structure of the phase shift mask, an etch process for forming the phase shift pattern 112 is performed by calculating an etch rate and determining a time necessary to etch the substrate to a desired depth. However, such a method does not consider parameters based on etch environments, such as a pattern density and an etching apparatus. Due to such parameters, the phase shift pattern 112 may not be formed at a desired depth. Consequently, a phase difference deviation occurs in the phase shift region, causing pattern failure during pattern transfer.

SUMMARY

An embodiment of the present invention is directed to providing a method of fabricating an alternating phase shift mask, which is capable of controlling an etch depth during an etch process for forming a phase shift pattern of the alternating phase shift mask.

In one embodiment, a method of fabricating an alternating phase shift mask may include, for example: defining transparent regions by forming light blocking patterns over a transparent substrate; forming an etch stop layer within the transparent substrate of a phase shift region among the transparent regions; and etching the transparent substrate of the phase shift region by using the etch stop layer.

The etch stop layer may be formed, for example, at a depth at which a phase difference between the phase shift region and the transparent regions is 180 degrees.

The etch stop layer may be formed in a low transmittance region having a lower transmittance than that of the transparent substrate. In this case, the low transmittance region may be formed by using laser irradiation. The etching of the transparent substrate of the phase shift region by using the etch stop layer may include, for example: selectively etching the transparent substrate of the phase shift region; measuring a transmittance intensity from the low transmittance region during the etch process; and determining completion of the etch based on the measured transmittance intensity.

Determination of completion of the etch process may be based, for example, on the measured transmittance intensity being greater than a threshold transmittance intensity value. Determination of completion of the etch process may also be based, for example, on a rate of change of the measured transmittance intensity being greater than a threshold transmittance intensity rate of change value.

In another embodiment, a method of fabricating an alternating phase shift mask includes: preparing a transparent substrate having a main pattern region and a frame region surrounding the main pattern region; defining transparent regions within the main pattern region and a dummy pattern region within the frame region by forming light blocking patterns over the transparent substrate; forming an etch stop layer within the transparent substrate of the dummy pattern region; and etching the transparent substrate of a phase shift region within the transparent regions and the transparent substrate of the dummy pattern region by using the etch stop layer.

The etch stop layer may be formed at a depth at which a phase difference between the phase shift region and the transparent regions is 180 degrees.

The etch stop layer may be formed in a low transmittance region having a lower transmittance than that of the transparent substrate. In this case, the low transmittance region may be formed by using a laser irradiation. The etching of the transparent substrate of the phase shift region within the transparent regions and the transparent substrate of the dummy pattern region by using the etch stop layer may include: selectively etching the transparent substrate of the phase shift region and the transparent substrate of the dummy pattern region; measuring a transmittance intensity from the low transmittance region during the etch process; and determining completion of the etch process based on the measured transmittance intensity.

Determination of completion of the etch process may be based, for example, on the measured transmittance intensity being greater than a threshold transmittance intensity value. Determination of completion of the etch process may also be based, for example, on a rate of change of the measured transmittance intensity being greater than a threshold transmittance intensity rate of change value.

In one embodiment, a system for fabricating an alternating phase shift mask may comprise circuitry enabled to irradiate a portion of a prepared transparent substrate, where the portion of the prepared transparent substrate may have formed in it an etch stop layer. Other circuitry may be enabled to be positioned in an area substantially under the etch stop layer to detect transmittance intensity due to the irradiation. Still other circuitry may be enabled to determine completion of etch process of a substrate substantially similar to the prepared transparent substrate based on the detected transmittance intensity. In an embodiment of the invention, the prepared transparent substrate and the substrate substantially similar to the prepared transparent substrate may be the same substrate.

Determination of completion of the etch process may be based, for example, on the measured transmittance intensity being greater than a threshold transmittance intensity value. Determination of completion of the etch process may also be based, for example, on a rate of change of the measured transmittance intensity being greater than a threshold transmittance intensity rate of change value.

The etch stop layer may be formed in a low transmittance region having a lower transmittance than that of the transparent substrate, where the low transmittance region is formed by using laser irradiation.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Various embodiments of the present invention will be described with reference to accompanying drawings. However, the embodiments are for illustrative purposes only and are not intended to limit the scope of the invention.

Figure 1:
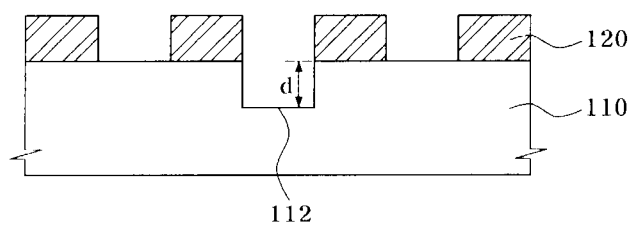
FIG. 1 is a cross-sectional view illustrating an example of an alternating phase shift mask.
Figure 2:
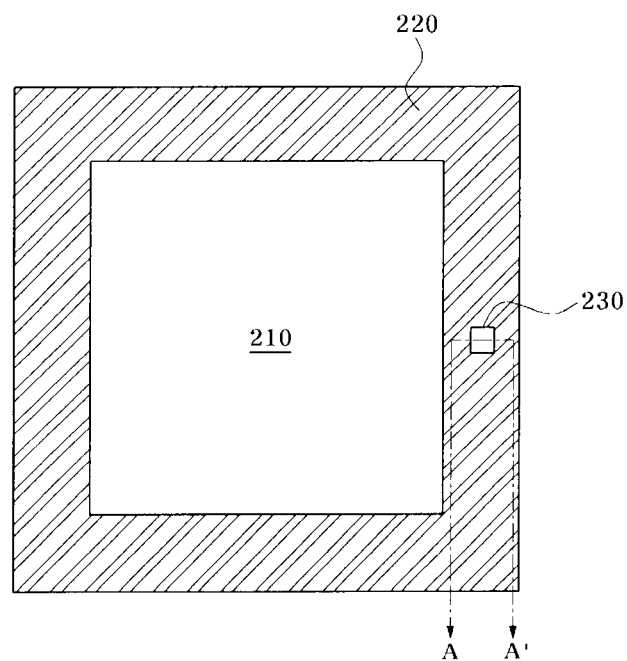
FIGS. 2 to 8 are views explaining a method of fabricating an alternating phase shift mask according to an embodiment of the present invention.
Figure 3:
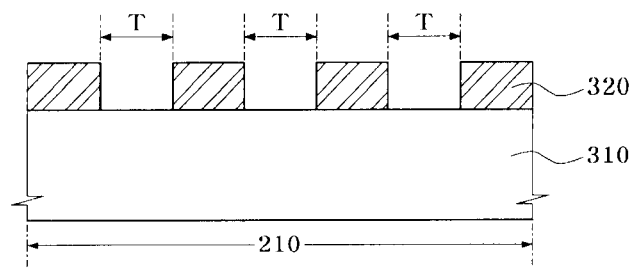
Figure 4:
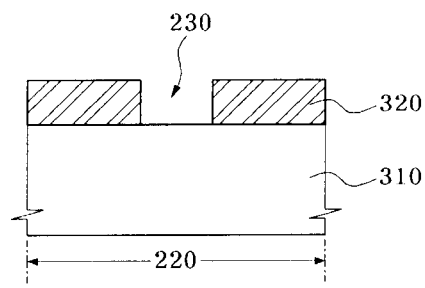
Figure 5:
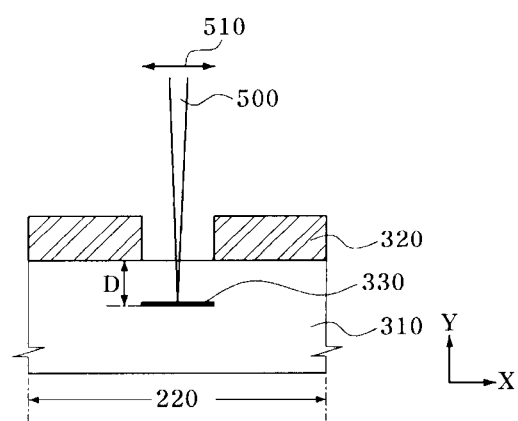
Figure 6:
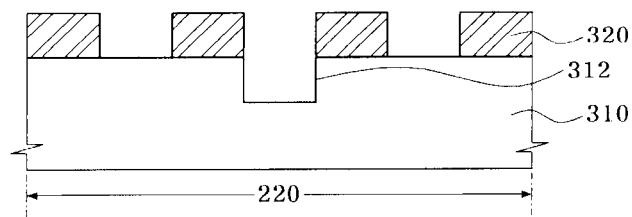
Figure 7:
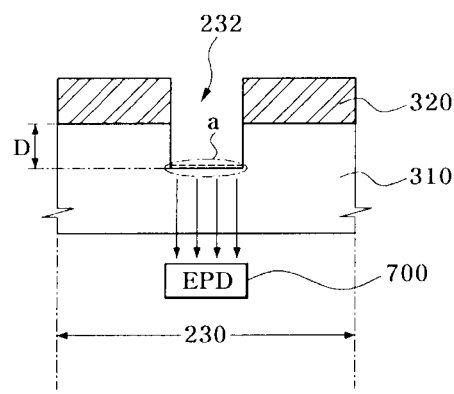
Figure 8:
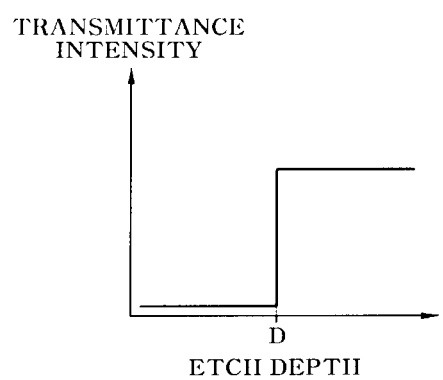

FIGS. 2 to 8 are views explaining a method of fabricating an alternating phase shift mask according to an embodiment of the present invention. Specifically, FIGS. 3 and 6 are cross-sectional views illustrating a main pattern region 210 of FIG. 2, and FIGS. 4, 5 and 7 are cross-sectional views taken along line A-A' of FIG. 2 in a frame region 230. FIG. 8 is a graph showing an output signal of an etch end point detector (EPD) 700.

Referring to FIGS. 2 and 3, a transparent substrate 310 having a main pattern region 210 and a frame region 220 is prepared. The frame region 220 is disposed to surround the main pattern region 210, but it is not limited thereto. A quartz substrate may be used as the transparent substrate 310. Light blocking patterns 320 are formed over the transparent substrate 310. The light blocking patterns 320 may be formed using a chromium (Cr) film. As illustrated in FIG. 3, the light blocking patterns 320 in the main pattern region 210 define transparent regions T exposing the transparent substrate 310. Trench-shaped phase shift patterns are formed in some of the transparent regions T by a subsequent etch process. As illustrated in FIG. 4, the light blocking patterns 320 in the frame region 220 are formed to cover the transparent substrate 310, except for a dummy pattern region 230.

Referring to FIG. 5, an etch stop layer is formed inside the transparent substrate 310 of the dummy pattern region 230 which is defined within the frame region 220 by the light blocking patterns 320. In this embodiment, the etch stop layer is formed as a low transmittance region 330 having a lower transmittance than that of the transparent substrate 310. The low transmittance region 330 may be formed, for example, by irradiating a laser 500 on the transparent substrate 310 of the dummy pattern region 230.

That is, as indicated by an arrow 510, a portion of the transparent substrate 310 may be damaged to a predetermined depth D while moving the laser 500 in an x direction. The low transmittance region 330 having a lower transmittance than an original transmittance is formed in a region damaged by the laser 500. Thus, the depth D of the low transmittance region 330 may be equal to the depth of the trench-shaped phase shift mask formed within the main pattern region 210. Therefore, the depth D of the low transmittance region 330 is set to a depth at which a 180-degree phase difference is exhibited when compared with an optical phase in the transparent region within the main pattern region 210, and the focusing of the laser 500 is set to the depth D during the irradiation of the laser 500.

Referring to FIGS. 6 and 7, the transparent substrate 310 exposed in the phase shift region within the main pattern region 220, and the transparent substrate 310 exposed in the dummy pattern region within the frame region 230 are etched by using a predetermined mask pattern (not shown). As one example, the etch process is performed by a dry etching process using plasma. As illustrated in FIG. 7, during the etch process, an etch end point is detected using an etch end point detector (EPD) 700 installed under the frame region 230.

Specifically, the etch end point detector 700 receives a signal passing through the low transmittance region 330, as indicated by arrows. The signal may be light irradiated toward the low transmittance region 300 from above, or may be a plasma wavelength in the case of a dry etch process using plasma. In either case, as illustrated in FIG. 8, a transmittance intensity rapidly increases at a predetermined time, that is, at the moment when the etched depth reaches the set depth D. This is because the low transmittance region 330 existing at the depth D is etched and thus the transmittance intensity blocked by the low transmittance region 330 rapidly increases, as indicated by "a" in FIG. 7.

The etch process may be deemed to be completed based on measurement of the transmittance. For example, various exemplary embodiment of the invention may deem the etch process to be completed by determining when the measured transmittance increases beyond a determined threshold transmittance value. Various embodiments of the invention may deem the etch process to be completed when a measured transmittance rate of increase goes beyond a determined threshold transmittance rate of increase value. Various embodiments of the invention may use other ways to determine when the etch process is completed. The specific method of determining the completion of the etch process may be design and/or implementation dependent.

When the etch process is completed, a trench-shaped dummy pattern 232 having the set depth D is formed in the frame region 230. Also, since the etch process for forming the dummy pattern 232 and the etch process for forming the phase shift pattern 312 in the main pattern region 220 are performed under the same conditions at the same time, the phase shift pattern 312 having the same depth D as that of the dummy pattern 232 is formed as illustrated in FIG. 6.

According to the embodiments of the present invention, the etch stop layer is formed in the transparent substrate of the phase shift region or the transparent substrate of the dummy pattern region, and the transmittance with respect to the etch stop layer is measured during the etch process for forming the phase shift pattern. The etch process may be deemed to be completed based on measurement of the transmittance, thereby forming the phase shift pattern having the depth at which the 180-degree phase difference can be realized.

Although various embodiments of the invention have been described where the dummy pattern region 230 is on the same substrate as the transparent substrate 310, the invention need not be so limited. For example, the dummy pattern region 230 may be on a similar transparent substrate that may be a separate transparent substrate, and the transparent substrate 310 may comprise at least one substrate.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A system for fabricating an alternating phase shift mask, the system comprising:
   one or more circuitry enabled to irradiate at least a portion of a prepared transparent substrate, wherein the at least a portion of the prepared transparent substrate has formed in it an etch stop layer;
   one or more circuitry enabled to be positioned in an area substantially under the etch stop layer to detect transmittance intensity due to the irradiation; and
   one or more circuitry enabled to determine completion of etch process of a substrate substantially similar to the prepared transparent substrate based on the detected transmittance intensity,
   wherein the one or more circuitry enabled to determine completion of etch process determines completion of the etch process based on a rate of change of the measured transmittance intensity being greater than a threshold transmittance intensity rate of change value, and
   wherein the etch stop layer is formed in a low transmittance region having a lower transmittance than that of the transparent substrate.

2. The system of claim 1, wherein the prepared transparent substrate and the substrate substantially similar to the prepared transparent substrate are the same substrate.

3. The system of claim 1, wherein the one or more circuitry enabled to determine completion of etch process determines completion of the etch process based on the detected transmittance intensity being greater than a threshold transmittance intensity value.

4. The system of claim 1, wherein the low transmittance region is formed by using laser irradiation.

* * * * *